US010060821B2

(12) United States Patent
McNab et al.

(10) Patent No.: US 10,060,821 B2
(45) Date of Patent: Aug. 28, 2018

(54) DETECTION APPARATUS AND METHOD

(71) Applicant: GE Oil & Gas UK Limited, Nailsea, Bristol (GB)

(72) Inventors: John Cross McNab, Newcastle-upon-Tyne (GB); Geoffrey Stephen Graham, Newcastle-upon-Tyne (GB); Philip Michael Hunter Nott, Newcastle-upon-Tyne (GB)

(73) Assignee: GE Oil & Gas UK Limited, Nailse, Bristol (GB)

( * ) Notice: Subject to any disclaimer, the term of this patent is extended or adjusted under 35 U.S.C. 154(b) by 12 days.

(21) Appl. No.: 15/029,593

(22) PCT Filed: Oct. 23, 2014

(86) PCT No.: PCT/GB2014/053159
§ 371 (c)(1),
(2) Date: Apr. 14, 2016

(87) PCT Pub. No.: WO2015/063458
PCT Pub. Date: May 7, 2015

(65) Prior Publication Data
US 2016/0273994 A1    Sep. 22, 2016

(30) Foreign Application Priority Data

Oct. 29, 2013 (GB) .................. 1319099.6

(51) Int. Cl.
*G01R 31/14* (2006.01)
*G01M 3/18* (2006.01)
*G01R 31/02* (2006.01)

(52) U.S. Cl.
CPC ............. *G01M 3/18* (2013.01); *G01R 31/025* (2013.01)

(58) Field of Classification Search
CPC .................. G01M 3/18; G01R 31/025
(Continued)

(56) References Cited

U.S. PATENT DOCUMENTS 4,922,183 A * 5/1990 Kamas ................. G01M 3/165
324/522
5,090,259 A * 2/1992 Shishido ............. G01N 21/954
324/220

(Continued)

FOREIGN PATENT DOCUMENTS

CN    2181688 Y    11/1994
CN    101243311 A    8/2008
(Continued)

OTHER PUBLICATIONS

International Search Report and Written Opinion of the International Searching Authority, dated Apr. 8, 2015, for corresponding International Application No. PCT/GB2014/053159, 10 pages.

(Continued)

*Primary Examiner* — Jermele M Hollington
*Assistant Examiner* — Sean Curtis
(74) *Attorney, Agent, or Firm* — Klarquist Sparkman, LLP

(57) ABSTRACT

A detection apparatus arranged to detect defects within a flexible pipe body. The detection apparatus comprises an electrical power supply and a first meter. The electrical power supply is arranged to couple between, and to supply current to, first and second electrically conductive members extending at least partially along the length of a flexible pipe body and electrically isolated from one another except for being electrically connected at a point remote from the power supply. The first meter is arranged to detect variation between the current flowing in each electrically conductive member. Detected variation is indicative of a pipe body (Continued)

defect causing an Earth fault along one of the electrically conductive members. A corresponding method, a pipeline apparatus including the detection apparatus and a method of forming the pipeline apparatus are also disclosed.

7 Claims, 6 Drawing Sheets

(58) Field of Classification Search
USPC .................................. 324/220–221, 509, 539
See application file for complete search history.

(56) References Cited

U.S. PATENT DOCUMENTS

| | | | | |
|---|---|---|---|---|
| 5,969,618 | A * | 10/1999 | Redmond | G01M 3/18 174/11 R |
| 6,037,767 | A * | 3/2000 | Crescenzo | G01N 27/82 324/220 |
| 6,087,830 | A * | 7/2000 | Brandly | G01N 27/902 324/220 |
| 6,374,746 | B1 * | 4/2002 | Fiske | B61B 13/08 104/138.1 |
| 6,388,439 | B1 * | 5/2002 | Lembeye | G01B 7/14 324/207.16 |
| 6,498,991 | B1 * | 12/2002 | Phelan | G01M 3/18 138/104 |
| 7,555,936 | B2 * | 7/2009 | Deckard | F16L 11/127 138/104 |
| 7,839,282 | B1 * | 11/2010 | Mathur | G01N 27/221 324/519 |
| 8,087,430 | B1 * | 1/2012 | Betz | F16L 11/12 138/104 |
| 8,183,872 | B2 * | 5/2012 | Stark | F16L 11/127 324/539 |
| 8,997,792 | B2 * | 4/2015 | Betsinger | F16L 57/06 138/104 |
| 9,030,195 | B2 * | 5/2015 | Gies | G01N 27/82 324/220 |
| 9,400,227 | B2 * | 7/2016 | Ramos | G01M 3/002 |
| 9,435,709 | B2 * | 9/2016 | Hastreiter | G01M 3/18 |
| 9,535,024 | B2 * | 1/2017 | Betsinger | G01M 3/18 |
| 9,556,977 | B2 * | 1/2017 | McNab | G01L 1/242 |
| 9,562,822 | B2 * | 2/2017 | Wells | F16L 25/01 |
| 9,630,207 | B2 * | 4/2017 | Fernando | B29C 71/0009 |
| 9,677,967 | B2 * | 6/2017 | Pereira | G01M 5/0025 |
| 2004/0065377 | A1 * | 4/2004 | Whiteley | F16L 11/127 138/104 |
| 2005/0005716 | A1 * | 1/2005 | Harris | G01M 3/005 73/865.8 |
| 2010/0007325 | A1 * | 1/2010 | Stark | F16L 11/127 324/71.1 |
| 2013/0187641 | A1 * | 7/2013 | Singer | G01N 27/82 324/220 |
| 2013/0276931 | A1 * | 10/2013 | Fernando | B29C 71/0009 138/137 |
| 2014/0069542 | A1 * | 3/2014 | Graham | G01M 3/40 138/104 |
| 2014/0116564 | A1 * | 5/2014 | McNab | G01L 1/242 138/137 |
| 2014/0260705 | A1 * | 9/2014 | Kimpel, Jr. | G01M 99/00 73/865.8 |
| 2014/0345741 | A1 * | 11/2014 | Graham | F16L 11/083 138/137 |
| 2014/0373963 | A1 * | 12/2014 | Graham | B29C 35/0272 138/137 |
| 2015/0136264 | A1 * | 5/2015 | Holland | E21B 47/0006 138/104 |
| 2016/0054534 | A1 * | 2/2016 | McNab | E21B 17/01 29/426.1 |
| 2016/0238547 | A1 * | 8/2016 | Park | C08K 7/00 |
| 2016/0243742 | A1 * | 8/2016 | Fernando | B29C 71/0009 |
| 2016/0266001 | A1 * | 9/2016 | McNab | G01M 3/18 |
| 2016/0273994 | A1 * | 9/2016 | McNab | G01M 3/18 |
| 2017/0122894 | A1 * | 5/2017 | McNab | G01N 27/24 |
| 2017/0199100 | A1 * | 7/2017 | Nott | G01M 11/086 |

FOREIGN PATENT DOCUMENTS

| | | | | |
|---|---|---|---|---|
| EP | 0417061 | A1 * | 3/1991 | ............. G01M 3/18 |
| EP | 0417061 | A1 | 3/1991 | |
| EP | 2706338 | A1 | 3/2014 | |
| EP | 2725186 | A1 | 4/2014 | |
| EP | 3063520 | A1 * | 9/2016 | ............. G01M 3/18 |
| GB | 2440752 | A | 2/2008 | |
| WO | WO2011/143384 | A1 | 11/2011 | |
| WO | WO 2015063458 | A1 * | 5/2015 | ............. G01M 3/18 |

OTHER PUBLICATIONS

Search Report from the United Kingdom Intellectual Property Office, dated May 13, 2014, for corresponding United Kingdom Application No. GB1319099.6, 3 pages.

International Preliminary Report on Patentability and Written Opinion of the International Searching Authority, dated May 12, 2016, for corresponding International Application No. PCT/GB2014/053159, 8 pages.

Machine Translation and First Office Action and Search issued in connection with corresponding CN Application No. 201480059934.0 dated Jan. 31, 2018.

* cited by examiner

DETECTION APPARATUS AND METHOD

CROSS REFERENCE TO RELATED APPLICATIONS

This is the U.S. National Stage of International Application No. PCT/GB2014/053159, filed Oct. 23, 2014, which in turn claims the benefit of and priority to Great Britain Application No. GB1319099.6, filed Oct. 29, 2013.

The present invention relates to a detection apparatus and method. In particular, the present invention relates to a detection apparatus arranged to detect defects within a flexible pipe body, and a method of detecting defects of a flexible pipe body. Particular embodiments relate to a pipeline apparatus comprising a flexible pipe body and the detection apparatus, and a method of forming such a pipeline apparatus.

Traditionally, flexible pipe is utilised to transport production fluids, such as oil and/or gas and/or water, from one location to another. Flexible pipe is particularly useful in connecting a sub-sea location (which may be deep underwater, say 1000 meters or more) to a sea level location. The flexible pipe may have an internal diameter of typically up to around 0.6 meters. Flexible pipe is generally formed as an assembly of at least one flexible pipe body and one or more end fittings. The flexible pipe body is typically formed as a combination of layered materials that form a pressure-containing conduit. The pipe structure allows large deflections without causing bending stresses that impair the flexible pipe's functionality over its lifetime. The pipe body is generally built up as a combined structure including metallic and polymer layers.

In many known flexible pipe designs the pipe body includes one or more pressure armour layers. The primary load on such layers is formed from radial forces. Pressure armour layers often have a specific cross section profile to interlock so as to be able to maintain and absorb radial forces resulting from outer or inner pressure on the pipe. The cross sectional profile of the wound wires which thus prevent the pipe from collapsing or bursting as a result of pressure are sometimes called pressure-resistant profiles. When pressure armour layers are formed from helically wound wire forming hoop components, the radial forces from outer or inner pressure on the pipe cause the hoop components to expand or contract, putting a tensile load on the wires.

In many known flexible pipe designs the pipe body includes one or more tensile armour layers. The primary loading on such a tensile armour layer is tension. In high pressure applications, such as in deep and ultra-deep water environments, the tensile armour layer experiences high tension loads from a combination of the internal pressure end cap load and the self-supported weight of the flexible pipe. This can cause failure in the flexible pipe since such conditions are experienced over prolonged periods of time.

Unbonded flexible pipe has been used for deep water (less than 3,300 feet (1,005.84 meters)) and ultra-deep water (greater than 3,300 feet) developments. It is the increasing demand for oil which is causing exploration to occur at greater and greater depths where environmental factors are more extreme. For example, in such deep and ultra-deep water environments, ocean floor temperature increases the risk of production fluids cooling to a temperature that may lead to pipe blockage. Increased depths also increase the pressure associated with the environment in which the flexible pipe must operate. As a result the need for high levels of performance from the layers of the flexible pipe body is increased. Flexible pipe may also be used for shallow water applications (for example less than around 500 meters depth) or even for shore (overland) applications.

One way to improve the load response and thus performance of armour layers is to manufacture the layers from thicker and stronger and thus more robust materials. For example, for pressure armour layers in which the layers are often formed from wound wires with adjacent windings in the layer interlocking, manufacturing the wires from thicker material results in the strength increasing appropriately. However, as more material is used, the weight of the flexible pipe increases. Ultimately the weight of the flexible pipe can become a limiting factor in using flexible pipe. Additionally manufacturing flexible pipe using thicker and thicker material increases material costs appreciably, which is also a disadvantage.

Regardless of measures taken to improve the performance of armour layers within a pipe body, there remains a risk of defects arising within a flexible pipe. A defect may comprise damage to an outer wall of a flexible pipe body resulting in seawater ingress into an annulus within the pipe body such that seawater fills voids between the armour layer wires and other structural elements of the pipe. Armour layer wires and other structural elements are typically manufactured from steel or other metallic materials, which are vulnerable to accelerated corrosion upon contact with seawater. If such a defect is not detected promptly then the structural integrity of the pipe body can be compromised. Detection of defects has previously often required visual inspection of the pipe body, which can be hazardous, particular for deep water and ultra-deep water installations.

Certain embodiments of the invention provide the advantage that a defect within a pipe body can be detected without requiring periodic visual inspection. Defects can then be repaired, or the pipe body replaced. Detectable defects include a breach of the outer wall of a flexible pipe and the ingress of seawater into a pipe body annulus.

According to a first aspect of the present invention there is provided a detection apparatus arranged to detect defects within a flexible pipe body, the detection apparatus comprising: an electrical power supply arranged to couple between, and to supply current to, first and second electrically conductive members extending at least partially along the length of a flexible pipe body and electrically isolated from one another except for being electrically connected at a point remote from the power supply; and a first meter arranged to detect variation between the current flowing in each electrically conductive member; wherein detected variation is indicative of a pipe body defect causing an Earth fault along one of the electrically conductive members.

The variation between the current flowing in each electrically conductive member may be indicative of the position of the Earth fault along one of the electrically conductive members.

One of the electrically conductive members may comprise a sensor member exposed along at least part of the length of the flexible pipe body and having a predetermined resistance per unit length and the other electrically conductive member comprises a return member which is electrically insulated.

The electrical power supply may be arranged to supply a constant current to either the sensor member or the return member; wherein if a constant current is supplied to the sensor member, variation between the current flowing in each electrically conductive member is indicative of the distance along the sensor member from the electrical power supply to the Earth fault; and wherein if a constant current is supplied to the return member, variation between the current flowing in each electrically conductive member is indicative of the distance along the sensor member from the connection to the return member to the Earth fault.

The electrical power supply may comprise a first DC constant current source having a first terminal arranged to supply a constant current to a first electrically conductive member and a second terminal coupled to a second electrically conductive member.

The detection apparatus may further comprise a first resistor coupled between the second terminal of the first current source and the second electrically conductive member; wherein the first meter comprises a first voltmeter arranged to measure the voltage across the first resistor and to detect a drop in voltage indicative of an Earth fault.

The detection apparatus may further comprise a second voltmeter arranged to measure the voltage across the first current source; wherein one of the electrically conductive members comprises a sensor member exposed along at least part of the length of the flexible pipe body and has a predetermined resistance per unit length and the other electrically conductive member comprises a return member which is electrically insulated; and wherein a change in the voltage across the first current source is indicative of the distance along the sensor member from the end coupled to the first terminal of the first current source and the Earth fault.

The electrical power supply may further comprise: a second DC constant current source having a first terminal arranged to supply a constant current to the second electrically conductive member and a second terminal coupled to the first electrically conductive member; a second resistor coupled between the second terminal of the second current source and the first electrically conductive member; and a third voltmeter arranged to measure the voltage across the second resistor and to detect a drop in voltage indicative of an Earth fault.

The first and second current sources may be arranged such that only one supplies current to the electrically conductive members at a time; and wherein each current source is electrically isolated from the other.

The detection apparatus may further comprise a fourth voltmeter arranged to measure the voltage across the second current source; wherein a change in the voltage across the second current source is indicative of the distance along the sensor member from the end coupled to the first terminal of the second current source and the Earth fault.

According to a second aspect of the present invention there is further provided a method of detecting defects within a flexible pipe body, the method comprising: coupling an electrical power supply between first and second electrically conductive members extending at least partially along the length of a flexible pipe body and electrically isolated from one another except for being electrically connected at a point remote from the power supply; supplying current form the power supply to the first and second electrically conductive members; and detecting variation between the current flowing in each electrically conductive member; wherein detected variation is indicative of a pipe body defect causing an Earth fault along one of the electrically conductive members.

According to a third aspect of the present invention there is further provided a pipeline apparatus comprising: a flexible pipe body including first and second electrically conductive members extending at least partially along the length of a flexible pipe body and electrically isolated from one another except for being electrically connected at a point remote from a first end of the flexible pipe body; an end fitting coupled to at least said first end of the flexible pipe body; and a detection apparatus as described above coupled to the end fitting; wherein the electrical power supply is coupled between, and arranged to supply current to, the first and second electrically conductive members.

The first and second electrically conductive members may be positioned within a pipe body annulus between an innermost barrier layer and an outermost barrier layer.

One of the electrically conductive members may comprise a sensor member exposed along at least part of the length of the flexible pipe body and has a predetermined resistance per unit length and the other electrically conductive member comprises a return member which is electrically insulated.

The sensor member and the other electrical member may comprise wires; wherein the pipe body further comprises at least one metallic structural element connected to an Earth; and wherein the sensor member is arranged such that if a pipe body defect admits fluid into the pipe body annulus, fluid between the sensor member and a metallic structural element causes an Earth fault.

According to a fourth aspect of the present invention there is provided a method of forming a pipeline apparatus, the method comprising: providing a flexible pipe body including first and second electrically conductive members extending at least partially along the length of a flexible pipe body and electrically isolated from one another except for being electrically connected at a point remote from a first end of the flexible pipe body; coupling an end fitting to at least one end of the pipe body; coupling a detection apparatus as described above to the end fitting; and coupling the electrical power supply between the first and second electrically conductive members.

The pipe may be for high pressure use in oil and gas extraction.

Embodiments of the invention are further described hereinafter with reference to the accompanying drawings, in which.

In the drawings like reference numerals refer to like parts.

Figure 1:
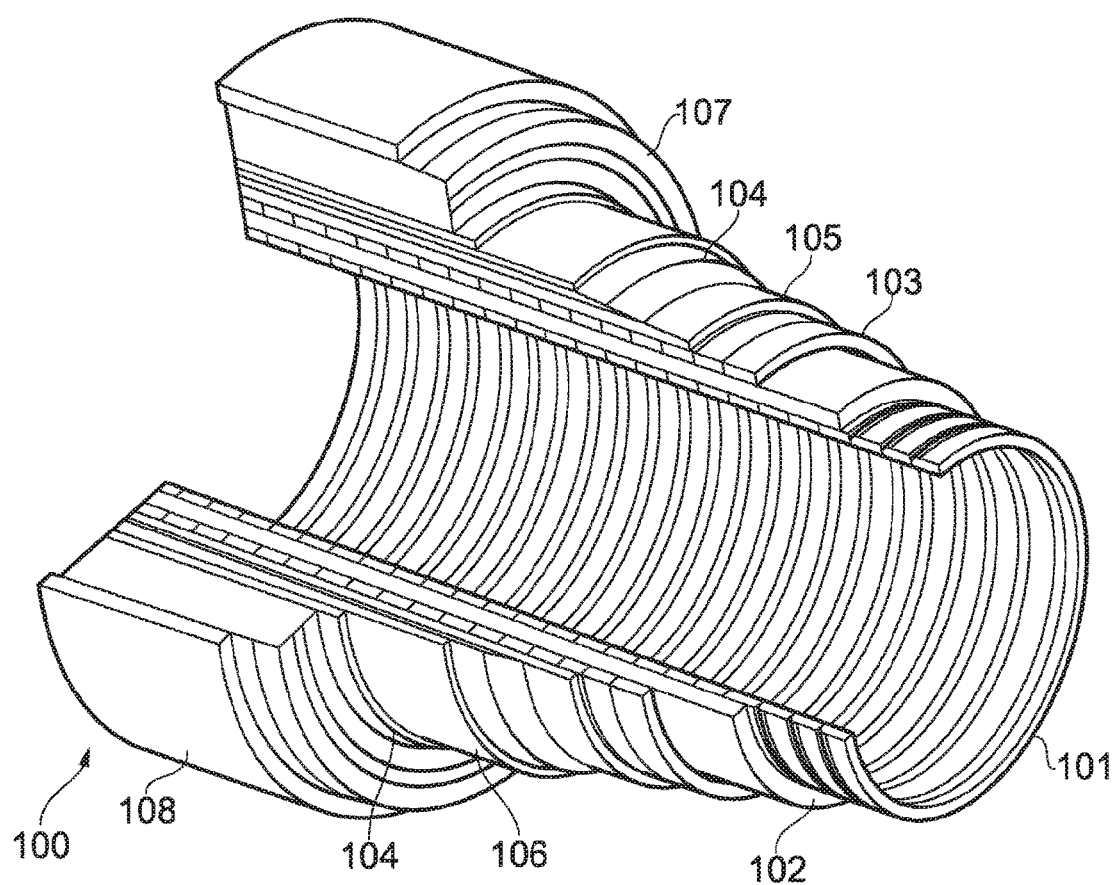
FIG. 1 illustrates a flexible pipe body.

Throughout this description, reference will be made to a flexible pipe. It will be understood that a flexible pipe is an assembly of a portion of a flexible pipe body and one or more end fittings in each of which a respective end of the pipe body is terminated. FIG. 1 illustrates how pipe body 100 is formed in accordance with an embodiment of the present invention from a combination of layered materials that form a pressure-containing conduit. Although a number of particular layers are illustrated in FIG. 1, it is to be understood that the present invention is broadly applicable to coaxial pipe body structures including two or more layers manufactured from a variety of possible materials. It is to be further noted that the layer thicknesses are shown for illustrative purposes only.

As illustrated in FIG. 1, a pipe body includes an optional innermost carcass layer 101. The carcass provides an interlocked construction that can be used as the innermost layer to prevent, totally or partially, collapse of an internal pressure sheath 102 due to pipe decompression, external pressure, and tensile armour pressure and mechanical crushing loads. It will be appreciated that certain embodiments of the present invention are applicable to 'smooth bore' operations (i.e. without a carcass) as well as such 'rough bore' applications (with a carcass).

The internal pressure sheath 102 acts as a fluid retaining layer and comprises a polymer layer that ensures internal fluid integrity. It is to be understood that this layer may itself comprise a number of sub-layers. It will be appreciated that when the optional carcass layer is utilised the internal pressure sheath is often referred to by those skilled in the art as a barrier layer. In operation without such a carcass (so-called smooth bore operation) the internal pressure sheath may be referred to as a liner.

An optional pressure armour layer 103 is a structural layer with a lay angle close to 90° that increases the resistance of the flexible pipe to internal and external pressure and mechanical crushing loads. The layer also structurally supports the internal pressure sheath, and typically consists of an interlocked construction.

The flexible pipe body also includes an optional first tensile armour layer 105 and optional second tensile armour layer 106. Each tensile armour layer is a structural layer with a lay angle typically between 10° and 55°. Each layer is used to sustain tensile loads and internal pressure. The tensile armour layers are often counter-wound in pairs.

The flexible pipe body shown also includes optional layers of tape 104 which help contain underlying layers and to some extent prevent abrasion between adjacent layers.

The flexible pipe body also typically includes optional layers of insulation 107 and an outer sheath 108, which comprises a polymer layer used to protect the pipe against penetration of seawater and other external environments, corrosion, abrasion and mechanical damage.

Each flexible pipe comprises at least one portion, sometimes referred to as a segment or section of flexible pipe body 100 together with an end fitting located at one end or both ends of the flexible pipe. An end fitting provides a mechanical device which forms the transition between the flexible pipe body and a connector. The different pipe layers as shown, for example, in FIG. 1 are terminated in the end fitting in such a way as to transfer the load between the flexible pipe and the connector.

Figure 2:
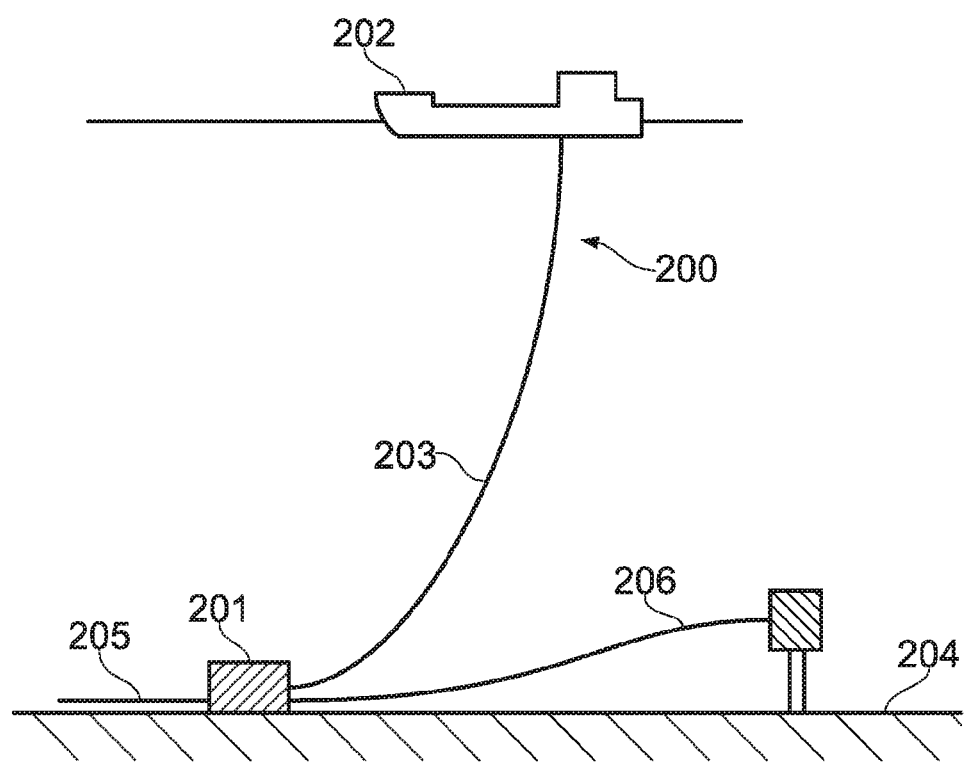
FIG. 2 illustrates a riser assembly incorporating a flexible pipe body.

FIG. 2 illustrates a riser assembly 200 suitable for transporting production fluid such as oil and/or gas and/or water from a sub-sea location 201 to a floating facility 202. For example, in FIG. 2 the sub-sea location 201 includes a sub-sea flow line 205. The flexible flow line 205 comprises a flexible pipe, wholly or in part, resting on the sea floor 204 or buried below the sea floor and used in a static application. The floating facility may be provided by a platform and/or buoy or, as illustrated in FIG. 2, a ship. The riser assembly 200 is provided as a flexible riser, that is to say a flexible pipe 203 connecting the ship to the sea floor installation. The flexible pipe may be in segments of flexible pipe body with connecting end fittings. FIG. 2 also illustrates how portions of flexible pipe can be utilised as a flow line 205 or jumper 206. It will be appreciated that there are different types of riser, as is well-known by those skilled in the art. Embodiments of the present invention may be used with any type of riser, such as a freely suspended (free, catenary riser), a riser restrained to some extent (buoys, chains), totally restrained riser or enclosed in a tube (I or J tubes).

As noted above, defects in a flexible pipe body can compromise the structural integrity of the pipe body. In particular, a breach or rupture of an outer seawater resistant layer can allow seawater ingress into the pipe body annulus between an innermost barrier layer and the outer seawater resistant layer. Alternatively, a breach in an innermost barrier layer can permit production fluids to enter the pipe body annulus. With reference to FIG. 1 the outer seawater resistant layer may comprise the polymer outer sheath 108 and the innermost barrier layer may comprise the internal pressure sheath 102. The pipe body annulus is occupied by metallic structural components such as the tensile armour layers 105, 106 of FIG. 1. Such components are frequently formed from steel or other metals which are susceptible to rapid corrosion in the presence of seawater or production fluids. There will now be described embodiments of the present invention which can detect a defect within a flexible pipe body which causes a breach of an outer seawater resistant layer or an innermost barrier layer of the pipe body.

Figure 3:
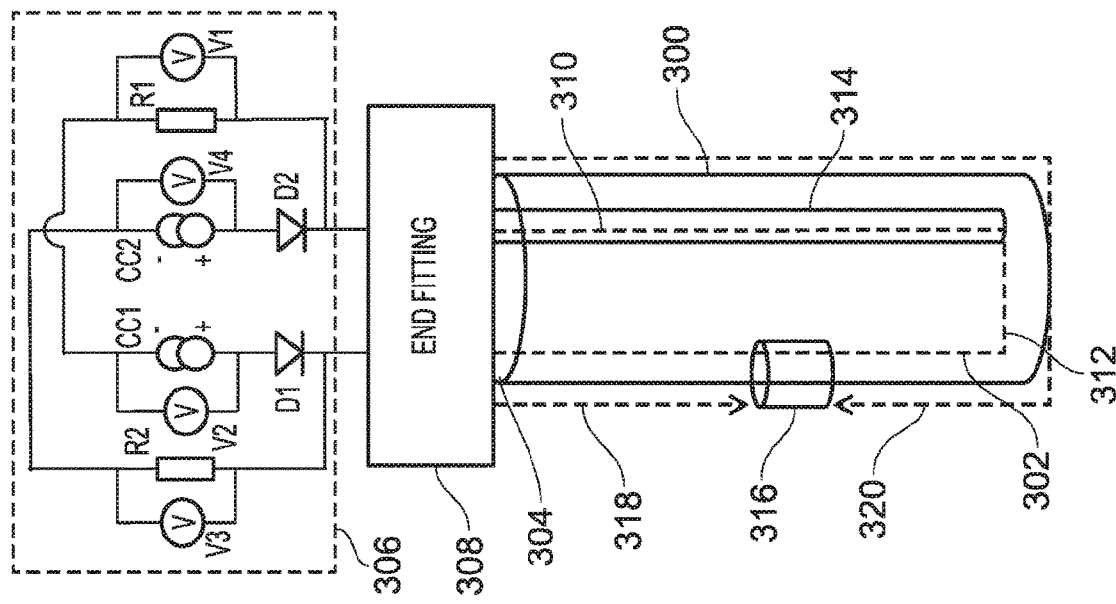
FIG. 3 illustrates a detection apparatus coupled to a flexible pipe body in accordance with a first embodiment of the present invention.

FIG. 3 illustrates a detection apparatus in accordance with a first embodiment of the present invention coupled to a flexible pipe body. The detection apparatus is arranged to detect a change to a flexible pipe body which may indicate a defect (and in particular a pipe breach allowing seawater or other fluids into the pipe body annulus). The detection apparatus may be coupled to a warning system (not illustrated) arranged to provide an output signal to an operator of the flexible pipe alerting the operator to potential damage to the pipe. The output signal may, for instance, be a visual or audible alarm.

The detection apparatus is arranged to detect shorting of an electrical circuit to Earth when an exposed wire comes into contact with fluid within the pipe annulus. Specifically, as illustrated in FIG. 3 flexible pipe body 300 is manufactured such that it includes a bare wire 302 extending at least partially along the length of the flexible pipe body 300 within the pipe body annulus. The wire 302 extends to a first end 304 of the flexible pipe body 300 at which it can be coupled to the detection apparatus 306 after passing through a bore within an end fitting 308. The end fitting 308 may be an Explosive Atmosphere (ATEX) compliant barrier. It will be appreciated that more generally the end fitting 308 may comprise an isolator, with the equipment and/or circuitry for ensuring ATEX compliance incorporated or applied elsewhere in the system. In this instance the end fitting functions as an isolator which isolates the detection apparatus in the pipe body annulus from Earth allowing the system integrity to be verified through the application of an voltmeter; if a current is flowing there is a short-circuit in the system indicating either fluid in the pipe or a problem with the system itself. Furthermore information about the potential measured can be used to determine the nature and location of a leak, as will be described below. Where there is reference to an end fitting in the remainder of this patent specification this should be understood as alternatively being an isolator. The wire 302 is electrically isolated from metallic structural components of the pipe body, for instance by spacing apart with insulating components, but is arranged such that fluid entering the pipe annulus can come into contact with the wire 302. The wire 302 is arranged to pass through the end fitting 308 while remaining electrically isolated from the end fitting 308. In the event of a breach causing fluid to come into contact with the wire 302 and metallic structural elements within the pipe annulus, a current passing through the wire 302 will short to the metallic structural elements which are in turn connected to an Earth. This sinking of the current to Earth can be detected by the detection apparatus 306, as will be described below.

It will be appreciated that the wire 302 may be more generally referred to as an electrically conductive member extending at least partially along the length of a flexible pipe body. The wire 302 may be a resistance wire with a known resistance per meter. Preferably, the wire 302 is not insulated (at least within a detection zone, as described below) to allow it to come into contact with fluids within the pipe body annulus. Electrical isolation can be achieved for a bare wire for instance by loosely wrapping the wire in a spiral wound insulator such that it is partially exposed along a spiral. Alternatively, the wire may run within an open channel in a polymer support extending along the pipe body. As discussed above, a flexible pipe body is constructed from multiple metallic structural elements, for instance the tensile armour wires in layers 105, 106 of FIG. 1. The metallic structural elements are designed to satisfy purely mechanical properties of the structure of the pipe body. However, provided at least one of the metallic components, for instance an individual tensile armour wire, is electrically isolated by an insulating medium, for instance the tape layers 104 of FIG. 1, then it may also be used to form the electrically conductive member.

As shown in FIG. 3, in accordance with the first embodiment of the invention, the flexible pipe body further includes a second wire 310 extending within the pipe body annulus. The first and second wires 302, 310 are electrically coupled together at their furthest point 312 (or at some point along their length remote from the detection apparatus 306). As for the first wire 302, the second wire is electrically isolated as it passes through the end fitting 308 to the detection apparatus 306. Collectively, the first and second wires 302, 310 form a circuit loop such that (at least in the absence of a breach) an electrical current can pass through one wire and return along the other. The second wire 310 differs from the first wire 302 in that it is typically fully electrically insulated along the whole of its length as indicated by insulation layer 314. Even if the second wire 310 is exposed to a fluid within the pipe annulus, the wire 310 is electrically isolated from the fluid by its own insulation layer 314.

Although the wires 302, 310 are shown widely spaced in FIG. 3, in practice they may run together through the pipe body annulus. In certain embodiments the first and second wires 302, 310 may be wrapped together in the spiral insulator noted above or in a braided insulator such that in the event of a breach, fluid can enter the spiral insulation and come into contact with the first wire 302 while the second wire 310 remains separately insulated. As will be described in greater detail below, the first wire 302 may have a known resistance per meter which allows the location of a breach to be determined. In contrast, there is no such constraint for the second wire 310 which may be formed from substantially any electrically conductive member (including, for instance, an individual tensile armour wire, so long as it can be fully insulated along its length).

Detection apparatus 306 is designed to provide a yes/no indication of a pipe breach. The detection apparatus 306 is designed to constantly monitor the pipe body to detect the occurrence of a breach. Advantageously, this requires only monitoring of a single parameter. It will be appreciated that certain embodiments of the present invention may further include a controller or processor coupled to various meters within the detection apparatus 306 to monitor measured parameters. They may further include memory for recording variation in a measured parameter over time.

Referring again to FIG. 3, to provide the initial indication of a pipe breach, the detection apparatus comprises a first constant current source CC1 coupled to the first wire 302 so as to supply an electrical current to the first wire 302. In the absence of a breach, as shown in FIG. 3, the current returns along the insulated second wire 310 and through a first resistor R1. The first constant current source CC1 is arranged to supply a constant current to the first wire, and may, for instance, comprises a constant current diode supply from a voltage source. In the absence of a breach, the voltage across the first resistor R1 as measure by a first voltmeter V1 is substantially constant. This voltage is determined by the supplied current from the first constant current source CC1 and a potential divider formed by the cumulative resistance of the first and second wires 302, 310 and the first resistor R1. This voltage may be constantly monitored to detect a breach indicated by a drop in the measured voltage. In particular, a breach may be indicated by the voltage dropping by more than a predetermined amount or dropping below a threshold. This provides a failsafe monitor in that disruption to the power supply will also cause the voltage to drop which is detected, and may be investigated. It is preferred to implement a detection apparatus that detects the interruption of flow of a current, rather than one in which current beginning to flow would indicate a breach as the latter option would not allow component failure to be detected.

Figure 4:
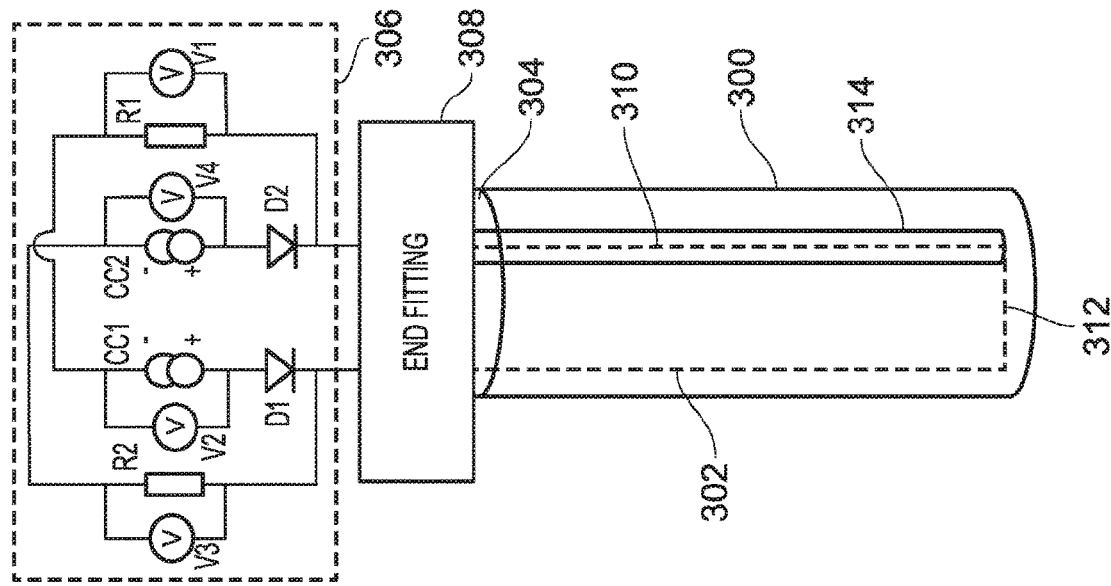
FIG. 4 illustrates the detection apparatus and flexible pipe body of FIG. 3 in the event of a defect which has caused a breach in a barrier layer within the flexible pipe body.

Referring now also to FIG. 4, in the event of a breach, for instance partway along the wires 302, 310 as indicated by breach zone 316, the current supplied by the first constant current source will sink to Earth (through wire 302 being coupled by fluid in the breach zone 316 to metallic structural elements, or to the surrounding sea water). This triggers a large drop in the voltage measured across the first resistor R1. This may be used to trigger an alarm, perhaps causing a visual inspection of the pipe body to take place. When a breach is detected, in certain embodiments the detection apparatus 306 is then arranged to detect the approximate location of the breach.

The first constant current source CC1, as noted above, is arranged to supply a constant current even in the event of a breach causing a short to Earth. Typically, this constant current may be 2 mA. A second voltmeter V2 is arranged to measure the voltage across the first constant current source CC1, which will be substantially constant in the absence of a breach. In the event of a breach the voltage measured by voltmeter V2 will increase owing to the reduced resistance between the first constant current source CC1 and Earth. It will be appreciated that monitoring for variation in the voltage measured by voltmeter V2 may also be used to initially detect a breach. As a further alternative, a breach may be detected for a detection circuit having a current source in which the current varies by directly measuring the current flowing in each wire 302, 310 at the point of connection to the detection apparatus 306.

The voltage measured by V2 can also be used in certain embodiments to calculate the distance along the first wire 302 to the breach zone 316, which is indicate by line 318 in FIG. 4. This is as a result of the first wire having a known resistance per meter in certain embodiments, for instance 2 $\Omega \cdot m^{-1}$. The resistance of the first wire between the first constant current source CC1 and the breach zone 316 is equal to the internal resistance of the first constant current source CC1, which in turn can be calculated through dividing the voltage measured by voltmeter V2 by the known constant current of the first constant current source CC1. The distance to the breach zone can then be calculated by dividing the calculated resistance by the resistance per meter of the first wire 302.

Additionally, when a breach is detected, the detection apparatus 306 is arranged to calculate the distance indicated by line 320 from the point 312 at which the first wire 302 is coupled to the second wire 310 (which may be the far end of the pipe body 300 if the wire 302 travels the full length of the pipe body 300). To achieve this, detection apparatus 306 further comprises a substantially identical second set of components arranged to drive a constant current from a second constant current source CC2 down the second wire 310 to return (if there is no breach) via the first wire 302 and a second resistor R2. Detection apparatus 306 further comprises first and second diodes D1, D2 arranged to isolate each half of the detection apparatus from one another. In alternative embodiments of the invention there may be further diodes provided to isolate resistors R1 and R2. In order to calculate distance 320 the first constant current source CC1 is turned off and the second constant current source CC2 is turned on. That is, the constant current sources are driven alternately. In the event of a breach the current from the second constant source CC2 sinks to Earth at the end of the breach zone 316 furthest from the detection apparatus 306. The voltage measured by voltmeter V4 can be used to calculate distance 320 given knowledge of the resistance per meter of the first wire 302 and the total resistance of the second wire 310 (if this is a significant amount).

It will be seen that the detection apparatus 306 includes a voltmeter V3 to measure the voltage across second resistor R2. In certain embodiments, while continuously monitoring for a breach the first and second current sources CC1, CC2 may be driven alternately in order to reduce capacitive charging between the wires 302, 310. Reduction of the voltage measured by either or both of voltmeters V1 and V3 during the respective monitoring phases is indicative of a breach.

It can be seen that, advantageously, the present invention allows not only the occurrence of a breach to be detected, but also the location and extent of the breach (the distance along first wire 302 from either end of the wire 302 to the breach zone 316). This information may be of great benefit when assessing the significance of a breach and assessing whether to perform a visual inspection. Certain embodiments of the present invention may result in location accuracy of 1 m or less even on risers in ultra-deep water installations.

In certain embodiments the location of the first wire 302 may be closely controlled within the pipe body annulus in order to prevent a small amount of condensation from falsely indicating a pipe breach. Specifically, the location of the first wire 302 may be controlled such that it is maintained at least a predetermined distance away from the nearest metallic structural component along the full length of wire 302. This may be achieved through the use of insulating spacers, for instance a spiral wrap or braiding of an insulating material as described above that allows fluid to enter through gaps between consecutive spirals but which spaces the first wire apart from surrounding metal structural components by at least the thickness of the insulating material. Other suitable techniques for routing sensor wires through a pipe body annulus will be well known to the skilled person. Additionally, the relative spacing between the first and second wires 302, 310 may be controlled to reduce capacitive charging.

Advantageously, the detection apparatus 306 and the wires 302, 310 extending along the pipe body 300 are low cost components, certainly relative to known techniques for detecting pipe breaches, such as fibre optic based Distributed Temperature Sensing (DTS) and visual inspection. Additionally, minimal data is collected or needs to be monitored to detect a breach and then to determine its location and extent. To detect a breach it is only necessary to monitor a single voltage or current (voltage across R1, R2, CC1 or CC2 or current returning to the detection apparatus). Monitoring two or more parameters, particularly if alternative positive and negative excitation is used, allows for redundancy. It is necessary only to monitor for a predetermined change in a measured parameter or to perform a comparison to a threshold. Advantageously, the first and second wires 302, 310 may be relative thin compared to the space available within a pipe body annulus, such that they do not significantly interfere with the pipe body structure. The detection apparatus 306 may also be relatively compact, which is desirable as space may be limited for instance at the head of a flexible riser.

As will be apparent from the above discussion, the detection apparatus 306 is able to determine the distance from each end of the pipe body 300 to the breach zone 316. Specifically, the detection apparatus 306 is able to determine the distance from each end of wire 302 to the first point along the wire which is shorted to Earth. Advantageously, this allows a second breach to be detected as the effect will be that the distance from one or other end of wire 302 to the first point where the wire 302 is shorted to Earth will be reduced. Subsequent breaches may be similarly detected so long as they occur closer to one or other end of the wire 302 than an existing breach. It will be apparent that in order to track a series of breaches it is necessary to maintain a record of the voltages across CC1 and CC2 as they change over time. This will also allow a significant breach which causes the pipe body annulus to fill up from the location of the breach to be tracked over time.

Figure 5:
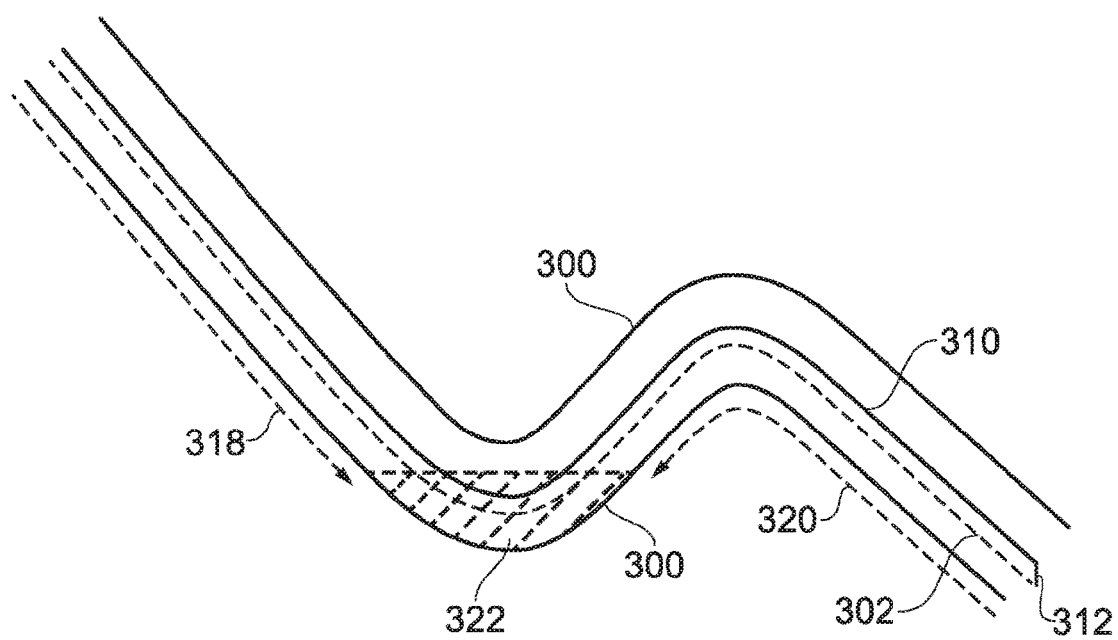
FIG. 5 illustrates how the detection apparatus of FIG. 3 can detect pooling of liquid at a mid-water arch within a flexible pipe body.

In certain applications, and in particular for risers, a sag bend in the flexible pipe body may be maintained for an extended period of time, or permanently. It is possible that small amounts of moisture present within the pipe body annulus may collect in a sag bend and cause a short circuit of wire 302 to Earth. This may not be indicative of a pipe breach, and may be tolerable. Advantageously, the detection apparatus 306 is able to detect a pipe breach occurring away from the sag bend. Additionally, a breach which occurs at the sag bend itself is detectable once the pipe annulus has taken on a small amount of additional fluid to cause the breach zone to expand along the first wire in at least one direction. A pipe body including a sag bend in which condensation has pooled is illustrated in FIG. 5. It can be seen that fluid has pooled in in the sag bend as indicated by the hashed lines in area 322. The pooled fluid 322 is sufficiently extensive to cover part of the first wire 302, such that the detection apparatus is able to determine distances 318 and 320 to the edges of the pooled fluid from each end of the first wire 302.

Figure 6:
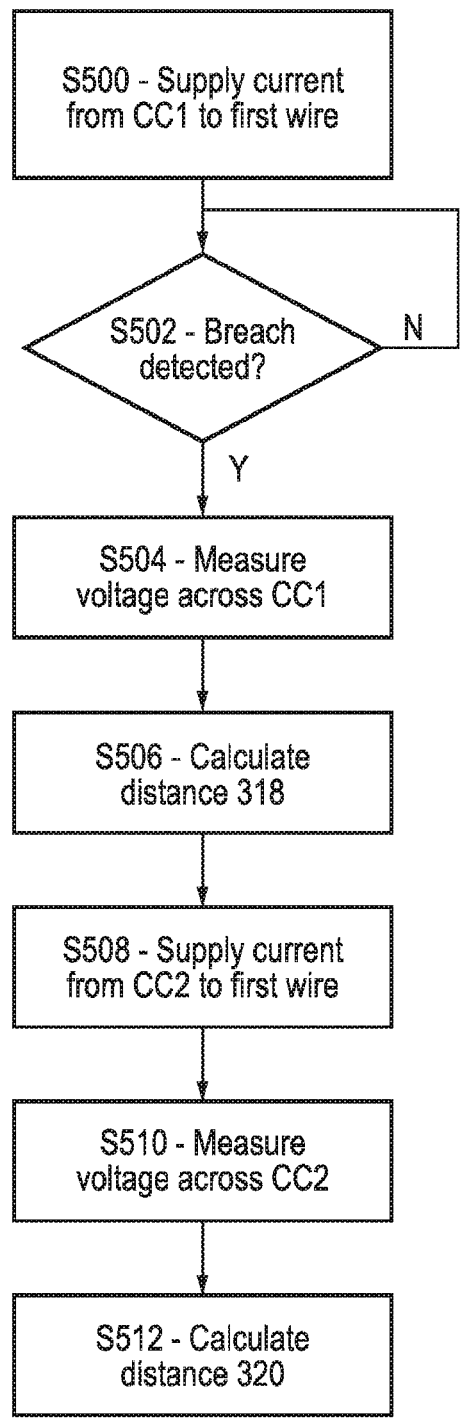
FIG. 6 is a flowchart illustrating a method of detecting and locating a breach in accordance with an embodiment of the present invention using the detection apparatus of FIGS. 3 and 4.

Referring now to FIG. 6, this illustrates in the form of a flowchart a method of detecting and locating a breach in accordance with an embodiment of the present invention using the detection apparatus shown in FIG. 3.

At step S500 the first constant current source CC1 supplies a current to the first wire 302. At step S502 it is determined whether a breach is detected by monitoring for variation in the voltage across R1. If no breach is detected the monitoring continues.

If a breach is detected, at step S504 the voltage across CC1 is measured and at step S506 the distance to the breach zone along the first wire 302 (distance 318) is calculated.

At step S508 the first constant current source is switched off and current is supplied by the second constant current source CC2. At step S510 the voltage across CC2 is measured and at step S512 the distance to the breach zone along the first wire 302 (distance 320) is calculated.

In accordance with a further embodiment of the present invention there may be provided multiple detection apparatuses each connected to a separate pair of wires within a single pipe body. Specifically, each detection apparatus and pair of wires may be arranged to detect breaches within detection zones (portions of the pipe body), which may or may not overlap with other separately monitored detection zones. By providing multiple sets this can provide redundancy in case of wire failure. Additionally, by providing multiple sets monitoring separate detection zones the approximate location of a breach can be rapidly determined as soon as there is a change in a measured parameter. To monitor only a detection zone comprising a portion of a pipe body remote from the end of the pipe body where the detection apparatus is mounted it is necessary to insulate the first wire 302 from that end until the desired detection zone is reached.

In accordance with a further embodiment of the present invention the first and second resistors R1, R2 may be omitted. In place a breach may be detected solely by monitoring the voltage developed across the constant current sources CC1, CC2 or by measuring current flowing in one or both wires 302, 310. It will be understood each option indicates if there is a variation in the current returning to the detection apparatus compared within the current supplied to a wire. Specifically, monitoring for variation in the voltage across a constant current source detects an increase in current flow due to the return current path being superseded by the flow to Earth.

It will be appreciated that the detection apparatus 306 may be further simplified for detecting a breach and the location of the breach from one end of the pipe body by providing only one constant current source (which would also allow the diodes D1, D2 to be dispensed with. However, such a simplified detection apparatus would not be able to determine the extent of the breach zone along the pipe body and would not be able to detect further breaches if they occur on the opposite side of a first breach from the detection apparatus.

The embodiments of the invention described above have focussed on the use of a DC constant current source (or a pair of DC constant current sources), though it will be appreciated that the present invention is not limited to this. In an alternative embodiment the detection apparatus may be replaced with an AC current source coupled between the first and second wires. Variation in the voltage across the AC current source is indicative of a breach. The voltage across the AC current source in each half cycle in the event of a breach will be indicative of the distance to the breach zone from either end of the first wire. It will be appreciated that the use of an AC constant current source involves a more complex detection circuit. Alternatively, using the detection apparatus shown in FIGS. 3 and 4 and AC detection apparatus may be achieved by switching the monitoring circuit at regular intervals, that is by alternately energising the first and second current sources CC1 and CC2. Advantageously, the use of alternating current may reduce polarisation build-up of certain liquids within the pipe body annulus, for instance seawater. Alternately energising the first and second current sources CC1 and CC2 would not require modification to the remainder of the detection apparatus shown in FIGS. 3 and 4.

Figure 7:
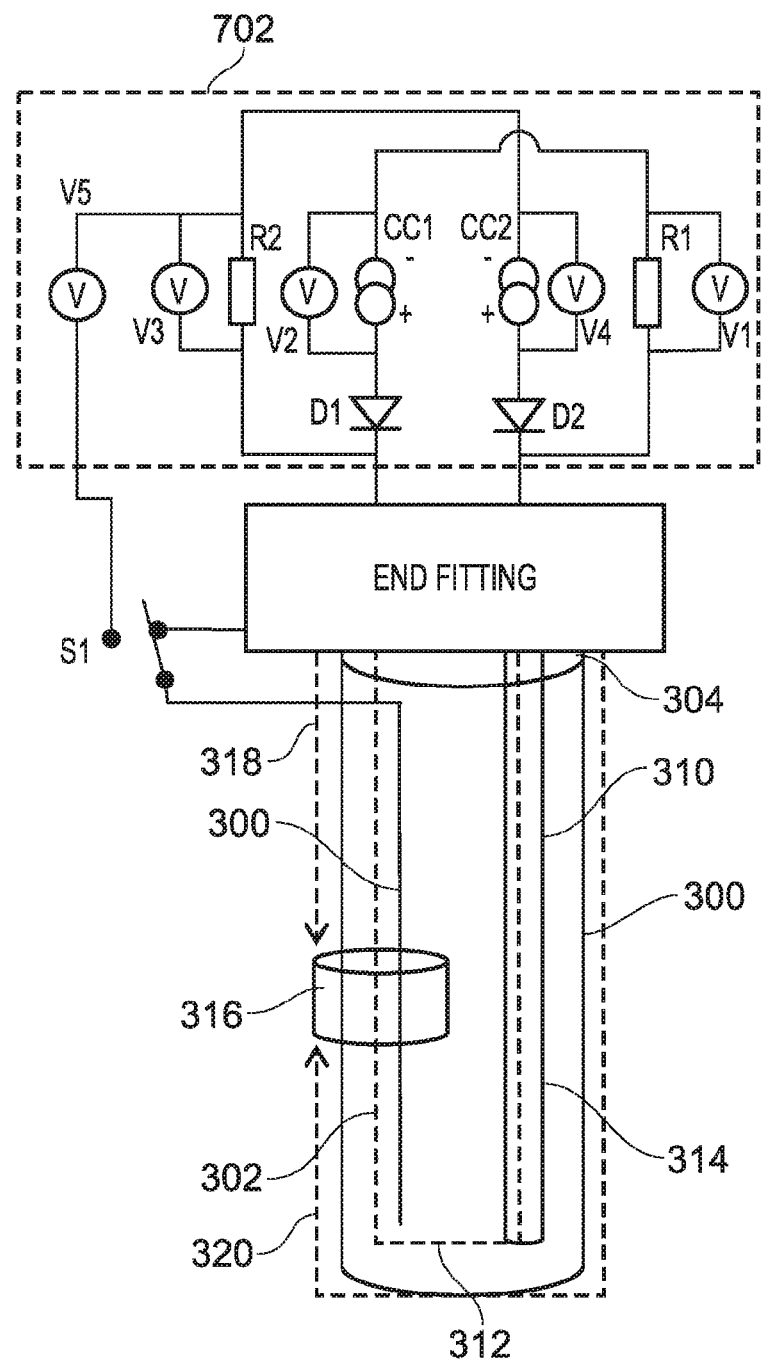
FIG. 7 illustrates a detection apparatus coupled to a flexible pipe body in accordance with a second embodiment of the present invention.

Referring to FIG. 7, in accordance with a further embodiment of the present invention a third wire 700 may be provided extending along the length of the pipe body. FIG. 7 is generally the same as FIG. 4, except for the additional wire 700 and further components within the detection apparatus 702, as will now be described. This third wire 700 is not insulated, as for the first wire 302, and is isolated from surrounding metallic structural components. The first 302 and third 700 wires may be placed close to one another such that in the event of a pipe breach in breach zone 316 the first 302 and third 700 wires are electrically coupled.

The principle of operation of the third wire 700 will be now be described. Under normal operation switch S1 is closed and the system operates as described above in connection with FIG. 3. When a small breach event occurs or water starts to condense and collect in the annulus of the pipe body, such as a bead of seawater or otherwise conducting water inside the sensing cable structure the sensing current passes into the third wire 700, which is connected to Earth through the end fitting 308 (in the same way that for the system of FIG. 3 the sensing current passes to Earth through metallic structural components within the pipe body annulus. V1 detects a change in voltage across R1 and S1 is switched over to connect to voltmeter V5, the other side of which is connected to the negative (Earthed) terminal of current source CC2. The voltage detected by voltmeter V5 is a direct measure of the location of the area of water detection. The wire 302 acts as a potentiometer and seawater ingress into the cable acts as the slider of the potentiometer. It will be appreciated that this method of detecting the location of the breach zone 316 may be in addition to the method described above in connection with FIG. 4, which advantageously further allows the size of the breach zone to be detected. The third cable 700 can also be used to calibrate the cable before installation by simply shorting wires 700 and 302 at some point along the length of the pipe body.

With the above-described arrangement defects including breaches of an outer seawater resistant layer or an innermost barrier layer of a pipe body can be detected in a timely manner, allowing further inspection, and if necessary maintenance, to take place.

It will be clear to a person skilled in the art that features described in relation to any of the embodiments described above can be applicable interchangeably between the different embodiments. The embodiments described above are examples to illustrate various features of the invention.

It will be further apparent that the detection apparatuses described above may be used in combination with other known types of detection apparatus either for reasons of resilience or to reduce the need for continuous operation of more computationally intensive detection apparatuses.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers or characteristics described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A pipeline apparatus comprising:
a flexible pipe body including a sensor member and a return member extending at least partially along the length of the flexible pipe body and electrically isolated from one another except for being electrically connected at a point remote from a first end of the flexible pipe body, wherein the sensor member is exposed along at least part of the length of the flexible pipe body and has a predetermined resistance per unit length and the return member is electrically insulated;
a first constant current source having a first terminal arranged to supply a constant electrical current to the sensor member and a second terminal coupled to the return member at the first end of the flexible pipe body; and
a first voltmeter arranged to measure the voltage across the first current source;
wherein a change in the voltage across the first current source is indicative of the distance along the sensor member from the end coupled to the first terminal of the first current source to a pipe body defect causing the sensor member to be connected to Earth.

2. A pipeline apparatus according to claim 1, wherein the sensor member and the return member are positioned within a pipe body annulus between an innermost barrier layer and an outermost barrier layer.

3. A pipeline apparatus according to claim 2, wherein the sensor member and the other electrical member comprise wires;
wherein the flexible pipe body further comprises at least one metallic structural element connected to Earth; and
wherein the sensor member is arranged such that if a pipe body defect admits fluid into the pipe body annulus, fluid between the sensor member and a metallic structural element causes the sensor member to be connected to Earth.

4. A pipeline apparatus according to claim 1, further comprising:

a second constant current source having a first terminal arranged to supply a constant current to the return member and a second terminal coupled to the sensor member; and
a second voltmeter arranged to measure the voltage across the second current source;
wherein a change in the voltage across the second current source is indicative of the distance along the sensor member from the end coupled to the first terminal of the second current source to the pipe body defect causing the sensor member to be connected to Earth.

5. A pipeline apparatus according to claim 4, wherein:
the first and second current sources are arranged such that only one supplies current to the sensor members or the return member at a time; and
wherein each current source is electrically isolated from the other.

6. A method of detecting defects within a flexible pipe body, the method comprising:
supplying electrical current from a first constant current source to a sensor member and a return member extending at least partially along the length of a flexible pipe body and electrically isolated from one another except for being electrically connected at a point remote from the power supply, wherein the sensor member is exposed along at least part of the length of the flexible pipe body and has a predetermined resistance per unit length and the return member is electrically insulated, and wherein the first constant current source has a first terminal arranged to supply a constant electrical current to the sensor member and a second terminal coupled to the return member at the first end of the flexible pipe body; and
measuring the voltage across the first current source;
wherein a change in the voltage across the first current source is indicative of the distance along the sensor member from the end coupled to the first terminal of the first current source to a pipe body defect causing the sensor member to be connected to Earth.

7. A method of forming a pipeline apparatus, the method comprising:
providing a flexible pipe body including a sensor member and a return member extending at least partially along the length of the flexible pipe body and electrically isolated from one another except for being electrically connected at a point remote from a first end of the flexible pipe body, wherein the sensor member is exposed along at least part of the length of the flexible pipe body and has a predetermined resistance per unit length and the return member is electrically insulated;
coupling a first terminal of a first constant current source to the sensor member and a second terminal of the first constant current source to the return member at the first end of the flexible pipe body such that it can supply a constant electrical current to the sensor member; and
coupling a first voltmeter to the first constant current source such that it can measure the voltage across the first current source;
wherein a change in the voltage across the first current source is indicative of the distance along the sensor member from the end coupled to the first terminal of the first current source to a pipe body defect causing the sensor member to be connected to Earth.

* * * * *